United States Patent [19]
Norris et al.

[11] Patent Number: 6,139,626
[45] Date of Patent: Oct. 31, 2000

[54] THREE-DIMENSIONALLY PATTERNED MATERIALS AND METHODS FOR MANUFACTURING SAME USING NANOCRYSTALS

[75] Inventors: David J. Norris, Princeton; Yurii A. Vlasov, Plainsboro, both of N.J.

[73] Assignee: NEC Research Institute, Inc., Princeton, N.J.

[21] Appl. No.: 09/148,521

[22] Filed: Sep. 4, 1998

[51] Int. Cl.[7] ..................................................... C30B 7/02
[52] U.S. Cl. ................................ 117/68; 117/70; 117/75; 501/38.1
[58] Field of Search .................................. 117/68, 70, 75; 501/38.1

[56] References Cited

U.S. PATENT DOCUMENTS

| | | |
|---|---|---|
| 5,262,357 | 11/1993 | Alivisatos et al. . |
| 5,385,114 | 1/1995 | Milstein et al. . |
| 5,491,114 | 2/1996 | Goldstein . |
| 5,559,057 | 9/1996 | Goldstein . |
| 5,576,248 | 11/1996 | Goldstein . |
| 5,585,640 | 12/1996 | Huston et al. ........................ 250/483.1 |
| 5,606,163 | 2/1997 | Huston el al. ........................... 250/337 |
| 5,651,818 | 7/1997 | Milstein et al. . |
| 5,670,279 | 9/1997 | Goldstein . |
| 5,688,318 | 11/1997 | Milstein et al. . |
| 5,705,321 | 1/1998 | Brueck et al. ........................... 430/316 |
| 5,711,803 | 1/1998 | Pehnt et al. . |
| 5,751,018 | 5/1998 | Alivisatos et al. ........................ 257/64 |
| 5,905,000 | 5/1999 | Yadav et al. ............................... 429/33 |
| 5,937,295 | 8/1999 | Chen et al. ............................... 438/257 |

OTHER PUBLICATIONS

Joannopoulos, J. D. et al., "Photonic crystals: putting a new twist on light," *Nature*, vol. 386, pp. 143–149 (Mar. 1997).
Imhof, A. et al., "Ordered macroporous materials by emulsion templating," *Nature*, vol. 389, pp. 948–951 (Oct. 1997).
van Blaaderen, A. et al., "Template–directed colloidal crystallization," *Nature*, vol. 385, pp. 321–324 (Jan. 1997).
Park, M. et al., "Block Copolymer Lithography: Periodic Arrays of ~$10^{11}$ Holes in 1 Square Centimeter," *Science*, vol. 276, pp. 1401–1404 (May 1997).
Tonucci, R. J. et al, "Nanochannel Array Glass," *Science*, vol. 258, pp. 783–785 (Oct. 1992).
Murray, C. B. et al., "Self–Organization of CdSe Nanocrystallites into Three–Dimensional Quantum Dot Superlattices," *Science*, vol. 270 (Nov. 1995).
Harfenist, S. A. et al., "Three–Dimensional Hexagonal Close–Packed Superlattice of Passivated Ag Nanocrystals," *Advanced Materials*, vol. 9, No. 10, pp. 817–822 (1997).
Goldstein, A. N. et al., "Melting in Semiconductor Nanocrystals," *Science*, vol. 256, pp. 1425–1427 (Jun. 1992).
Stöber, W. et al., "Controlled Growth of Monodisperse Silica Spheres in the Micron Size Range," *Journal of Colloid and Interface Science*, vol. 26, pp. 62–69 (1968).

(List continued on next page.)

*Primary Examiner*—Robert Kunemund
*Attorney, Agent, or Firm*—Andrew G. Isztwan

[57] ABSTRACT

A method for patterning materials according to a predetermined, three-dimensional pattern, as well as patterned materials produced by said methods, are provided. A template is prepared comprising a template material, the template having a plurality of pores therein, the plurality of pores comprising a negative of the predetermined, three-dimensional pattern. Colloidal nanocrystals sufficient to fill the pores in the template are also prepared. The pores in the template are filled with the colloidal nanocrystals. A quantum-dot solid is formed from the colloidal nanocrystals within the pores in the template, such that the colloidal nanocrystals are concentrated as close-packed nanocrystals within the pores in the template in the predetermined, three-dimensional pattern. If desired, a conventional solid may be obtained by sintering the close-packed nanocrystals within the pores of the template.

87 Claims, 6 Drawing Sheets

OTHER PUBLICATIONS

Markovich, G. et al., "Reversible Metal–Insulator Transition in Ordered Metal Nanocrystal Monolayers Observed by Impedance Spectroscopy," *Physical Review Letters*, vol. 80, No. 17, pp. 3807–3810 (Apr. 1998).

Kazumichi, Y. et al., "Neck formation of spherical silica particles by hydrothermal hot pressing," *Journal of Materials Science Letters*, vol. 10, pp. 7–8 (1991).

Murray, C. B. et al., "Synthesis and Characterization of Nearly Monodisperse CdE (E=S, Se, Te) Semiconductor Nanocrystallites," *Journal of the American Chemical Society*, vol. 115, No. 19, pp. 8706–8715 (1993).

Holland, B. T. et al., "Synthesis of Macroporous Minerals with Highly Ordered Three–Dimensional Arrays of Spheroidal Voids," *Science*, vol. 281, pp. 538–540 (Jul. 1998).

Wijnhoven, J. et al., "Preparation of Photonic Crystals Made of Air Spheres in Titania," *Science*, vol. 281, pp. 802–804 (Aug. 1998).

Heath, J. R., "The Chemistry of Size and Order on the Nanometer Scale," *Science*, vol. 270, pp. 1315–1316 (Nov. 1995).

THREE-DIMENSIONALLY PATTERNED MATERIALS AND METHODS FOR MANUFACTURING SAME USING NANOCRYSTALS

FIELD OF THE INVENTION

The present invention relates to the formation of three-dimensionally patterned materials. The invention allows the material to be patterned and/or ordered on a sub-micron length scale (and, in particular, on a nanometer-length scale), and therefore also relates to photonic crystals, photonic band gap materials, and other related optical materials.

BACKGROUND OF THE INVENTION

With modern methods of materials processing, structures can now be fabricated on the nanometer-length scale. As is well-known in the art, techniques developed in the semiconductor industry (e.g. electron beam lithography) can define complicated patterns with nanometer resolution. However, since these techniques are typically restricted to working at a material interface or surface layer (that is, in a typically two-dimensional format), much effort is required to use these methods to define a pattern in three dimensions. In particular, many layers of such a two-dimensional patterned material must typically be united to create a three-dimensionally patterned material. Many steps are required to produce each layer, and it therefore becomes prohibitive, both in terms of cost and time, to use these techniques to build multi-layered structures. Accordingly, a need exists for a simple method to make materials which are patterned in three dimensions. The present invention describes how to utilize recent developments in the chemistry of colloidal nanometer-scale particles (nanocrystals) to solve this problem.

It is presently known how to synthesize nanocrystals of a large variety of materials, including semiconductors, metals, and insulators, which are extremely homogeneous in terms of their size, shape, structure, and composition. In addition, it has been shown that under the proper conditions, the nanocrystals form close-packed solids, in which the nanocrystals are in contact but have not fused. See C. Murray et al., "Self-Organization of CdSe Nanocrystallites into Three-Dimensional Quantum Dot Superlattices," *Science,* Vol. 270, pp. 1335–1338 (Nov. 24, 1995). Close-packed nanocrystals, referred to herein as "quantum-dot solids," are artificial materials in which both the properties of the individual nanocrystalline building blocks and the interaction between them can be controlled. Therefore, the behavior of the solid can be tailored to fit a specific need.

It is believed that no method has yet been described by which a quantum-dot solid can be patterned in three dimensions. Such a method would be useful for construction of complicated optoelectronic devices which take advantage of the properties of these materials. For example, a single large-scale device could contain many quantum-dot solid "elements," such as photodiodes, light-emitting diodes, lasers, optical switches, and the like, all of which could be patterned on a single three-dimensional "chip." In addition, quantum-dot solids which are ordered in three dimensions are useful as "photonic" materials, which are discussed further below.

Prior art thin films and corresponding methods for making them, such as those disclosed in U.S. Pat. No. 5,262,357 to Alivisatos et al., U.S. Pat. No. 5,491,114 to Goldstein, U.S. Pat. No. 5,576,248 to Goldstein, and U.S. Pat. No. 5,711,803 to Pehnt et al., have demonstrated that when a thin layer of nanocrystals is deposited on an interface, the nanocrystals can be fused by heat to form a solid film. Significantly, these methods show that the nanocrystals fuse under temperatures much lower than the bulk melting temperature. Furthermore, U.S. Pat. No. 5,559,057 to Goldstein discloses a process by which such thin films can be patterned in two-dimensions. However, this process is again limited to an interface region, and extension of this method to patterns in three dimensions is difficult as described above.

In contrast to these prior art methods, in one embodiment of the present invention, a quantum-dot solid which is patterned in three dimensions can be obtained. In another embodiment, this material can be processed further. Specifically, by annealing or sintering this three-dimensionally patterned quantum-dot solid, the present invention also provides three-dimensional conventional solid structures in a straightforward manner.

One particular application in which a method for producing materials with a three-dimensional pattern is useful is in photonic crystals. A review of the properties and applications of such materials can be found in an article by Joannopoulos et al. entitled "Photonic Crystals: Putting a New Twist on Light," *Nature,* Vol. 386, pp. 143–149 (Mar. 13, 1997). Simply stated, a photonic crystal is a material with a periodic index of refraction. When the modulation of the index occurs on a length scale comparable to the wavelength of light, the material can modify the propagation of the photon through the material via diffraction. The extreme example is a photonic crystal which possesses a complete photonic band gap, a range of energies for which the photon cannot propagate in any direction inside the material.

Producing a photonic crystal is difficult, however, because one must fabricate a structure which is patterned and highly ordered in three dimensions. In addition, one must be able to pattern materials having a high index of refraction, such as semiconductors. Traditional semiconductor processing techniques (e.g. electron beam lithography) experience difficulty defining such patterns as described above.

Milstein et al. have described general methods for preparing photonic band gap materials in which the pores of a reticulated template are filled with a high index material. See U.S. Pat. Nos. 5,385,114, 5,651,818 and 5,688,318. The high index material is incorporated into the template either as a liquid or gas and then solidified. The template may then be removed by chemical means. Furthermore, Imhof et al. have described a method in which the template is filled by a gel. See Imhof et al., "Ordered Macroporous Materials by Emulsion Templating," *Nature,* Vol. 389, pp. 948–951 (Oct. 30, 1997).

In contrast to this prior art, the present invention, insofar as it pertains to photonic band gap materials, is an improvement over the prior art in that it allows nanometer-scale particles to fill the template. Moreover, unlike the Milstein et al. liquid-filling method, the present invention does not require the extreme temperatures typically needed for melting high index materials. Further, unlike the Milstein et al. gas-filling method, the present invention does not require a deposition chamber, which is expensive and limits the total sample thickness attainable. The present invention is simpler, does not require a complicated apparatus, and is more flexible, both in terms of selecting the fill-material and the template. Unlike the method of Imhof et al., the present invention is not limited to metal oxides (such as alumina, silica, titania, zirconia, etc.) as the fill-material. Any material which can be synthesized as a nanometer-sized particle and suspended as a colloid can be utilized as the fill-material in the present invention.

SUMMARY OF THE INVENTION

The present invention describes a simple method for preparing three-dimensionally patterned materials, including quantum-dot solids and conventional solids. The starting materials are colloidal nanocrystals and a porous template which represents the negative of the pattern to be established in the patterned material. The nanocrystals are preferably dissolved or suspended in a solvent compatible with both the template and the nanocrystals. The template may be patterned in any configuration, so long as the pores are contiguous and have dimensions larger than the nanocrystals used.

Figure 1:
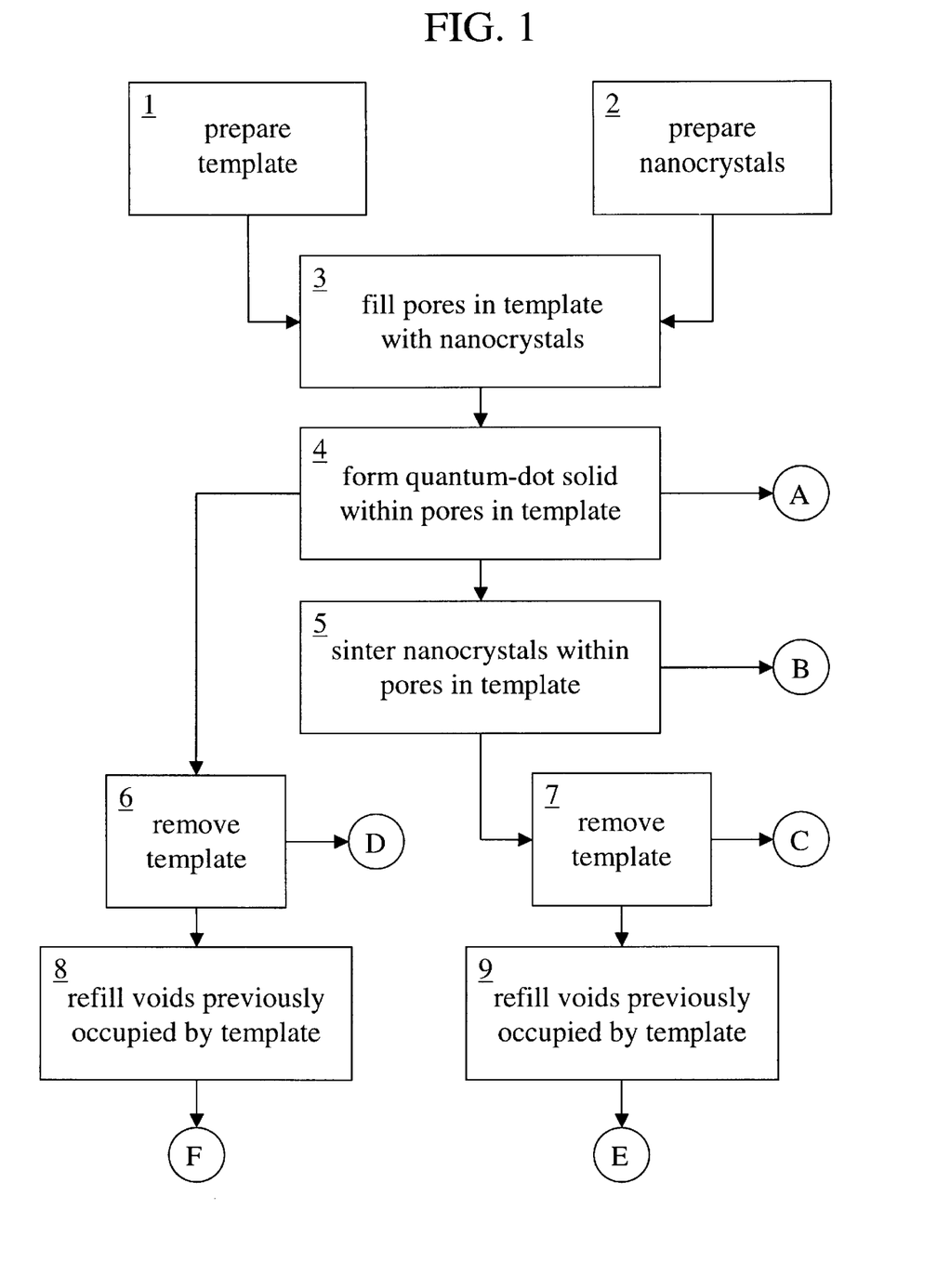
FIG. 1 is a flow diagram which depicts the steps of the methods for making three-dimensional patterned materials of the present invention, including the sequences of steps which produce six different variations (A–F) of three-dimensionally patterned materials of the present invention.

The process involves the following steps, as shown in FIG. 1: (steps 1 and 2) preparing both the porous template (having the negative pattern) and the colloidal nanocrystals; (step 3) filling the pores in the template with the colloidal nanocrystals; and (step 4) forming a quantum-dot solid from the colloidal nanocrystals within the template, such that the colloidal nanocrystals are concentrated as close-packed nanocrystals within the pores in the template in the desired three-dimensional pattern. This method provides a novel, three-dimensionally patterned quantum-dot solid which is supported by the template (material A identified in FIG. 1).

Further embodiments are possible through variations of several optional, further steps: (step 5) sintering the close-packed nanocrystals within the pores of the template to form a conventional solid; (steps 6 or 7) removing the template by chemical reaction or processing, thereby leaving voids in the positions where the template previously existed; and (steps 8 or 9) filling the voids previously occupied by the template with a supporting material. By utilizing these additional steps, the following additional materials may be produced by the present invention:

A material (identified as B in FIG. 1) which results from steps 1, 2, 3, 4 and 5—a three-dimensionally patterned conventional solid which is supported by the template.

A material (identified as C in FIG. 1) which results from steps 1, 2, 3, 4, 5 and 7—a three-dimensionally patterned conventional solid which is self-supporting.

A material (identified as D in FIG. 1) which results from steps 1, 2, 3, 4 and 6—a novel three-dimensionally patterned quantum-dot solid which is self-supporting.

A material (identified as E in FIG. 1) which results from steps 1, 2, 3, 4, 5, 7 and 9—a three-dimensionally patterned conventional solid which is supported by a supporting material.

A material (identified as F in FIG. 1) which results from steps 1, 2, 3, 4, 6 and 8—a novel three-dimensionally patterned quantum-dot solid which is supported by a supporting material.

Accordingly, a principal object of the present invention is to provide a simple and flexible method for manufacturing a material which is three-dimensionally patterned on a nanometer-length scale.

Another object of the present invention is to provide a method for manufacturing a three-dimensionally patterned quantum-dot solid which is patterned on a nanometer-length scale.

A further object of the present invention is to provide a method for manufacturing a three-dimensionally patterned conventional solid which is patterned on a nanometer-length scale.

A still further object of the present invention is to provide a method for manufacturing a three-dimensionally patterned photonic crystal which is patterned on a nanometer-length scale.

A still further object of the present invention is to provide a method for manufacturing a three-dimensionally patterned solid which has a high index of refraction and is patterned on a nanometer-length scale, wherein method does not require the use of extreme temperatures typically required for melting materials having a high index of refraction.

A still further object of the present invention is to provide a three-dimensionally patterned quantum-dot solid.

Other objects of the present invention will become more readily apparent in light of the following description in conjunction with the accompanying drawings.

BRIEF DESCRIPTION OF THE DRAWINGS

FIGS. 5A–5D are a schematic, cross-sectional views partially in magnification, illustrating the removal of the template to yield a self-supporting, three-dimensionally patterned quantum-dot solid in accordance with the present invention, wherein FIGS. 5C and 5D are magnified cross-sectional views of the resulting quantum-dot solid.

DETAILED DESCRIPTION OF THE PREFERRED EMBODIMENTS

Reference is now made to FIG. 1, which is a flow diagram illustrating the principal steps of the methods of the present invention and identifying the materials produced by these methods. In FIG. 1, rectangles denote method steps, and circled letters (A through F) identify materials (compositions of matter) produced by the methods of the present invention. In all methods, two starting materials are required: a porous template and colloidal nanocrystals to fill the pores in the template.

As shown in FIG. 1, step 1 involves preparing the template. A suitable template material for the template must possess several properties. First, the template must have the ability to incorporate a "negative" of a predetermined, three-dimensional pattern according to which the patterned material will be configured. It will be useful to elaborate upon several terms which are important to understanding the patterning contemplated by this invention.

The terms "three-dimensional pattern" and "three-dimensionally patterned" as used herein embrace any structural configuration which extends beyond a single, two-dimensional layer. Accordingly, these terms cover configurations which are unordered or randomly ordered in three dimensions; that is, the configurations embraced by these terms do not need to be regular or periodic in any way. However, these terms do also cover ordered configurations, including configurations which exhibit either two-dimensional order or three-dimensional order. A three-dimensional pattern which exhibits two-dimensional order has regularity or periodicity in two dimensions but not necessarily in the third dimension; an example is a plurality of axially parallel cylinders. An example of a three-dimensional pattern exhibiting three-dimensional order is shown in FIG. 2B (e.g. a plurality of stacked spheres or, alternatively, the volume comprised of the interstices between such stacked spheres).

The term "patterned material" as used herein denotes any material which is to be configured according to the predetermined pattern. Patterned material includes the nanocrystals (sintered and unsintered), and excludes the template, "voids" and "supporting materials" (which are discussed below). The predetermined pattern will have some of its volume occupied by patterned material and the remainder not occupied by patterned material (but which may be occupied by another entity, such as a vacuum, a gas (such as air), a liquid, or a supporting material as will be discussed below).

The "negative" of the predetermined pattern is a three-dimensional pattern in which the space to be occupied by the patterned material in the predetermined pattern is vacant in the negative pattern, while the space to be unoccupied by the patterned material in the predetermined pattern is occupied by the template material in the negative pattern. The vacant spaces in the negative pattern comprise the "pores" in the template, and are preferably contiguous so as to allow the colloidal nanocrystal solution to be easily filled therein as discussed below.

Figure 2A:
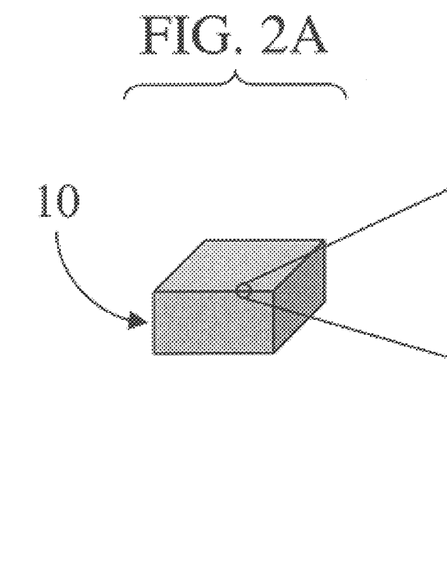
FIG. 2A is a perspective view of an illustrative template material (a synthetic opal) for use with the present invention, such illustrative template material being comprised of sub-micron silica spheres which are ordered on a face-centered cubic (fcc) lattice.
Figure 2B:
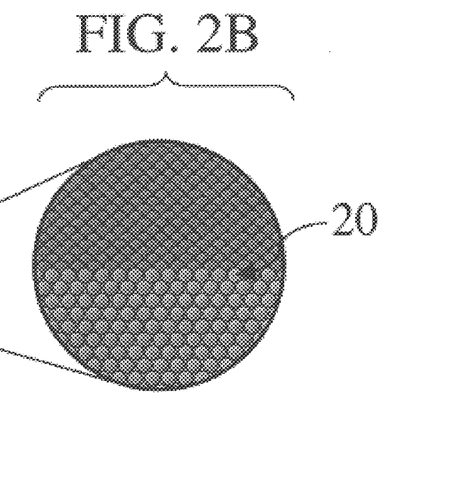
FIG. 2B is a magnified perspective view of a portion of the template material shown in FIG. 2A.

As shown in FIGS. 2A and 2B, the template 10 can be formed by self-assembly from some basic unit 20 which spontaneously organizes into a patterned and/or ordered structure. Several examples include sub-micron spheres which self-assemble into colloidal crystals (see A. van Blaaderen et al., "Template-Directed Colloidal Crystallization," *Nature,* Vol. 385, pp. 321–324 (Jan. 23, 1997)), block-copolymers which self-assemble into polymer arrays (see M. Park et al., "Block Copolymer Lithography: Periodic Arrays of ~$10^{11}$ Holes in 1 Square Centimeter," *Science,* Vol. 276, pp. 1401–1404 (May 30, 1997)), and optical fibers which can be induced to self-assemble into "nanochannel" glass (see Tonucci et al., "Nanochannel Array Glass," *Science, Vol.* 258, pp. 783–785 (Oct. 30, 1992)). The self-assembly process automatically imprints the negative pattern in the template.

The template material must also be chemically compatible with the solvent used to disperse the nanocrystals; that is, the template must be insoluble and unreactive in this solvent. If the nanocrystals are to be sintered after filling the template (as will be described below), the template must further have a melting temperature higher than the melting temperature of the nanocrystals. If the template is to be eliminated or replaced after filling, a process must also be known for easy removal of the template from the structure. An example of a template material which satisfies all of the above criteria and is discussed further below, is silica. However, other materials, including, but not limited to, glasses, polymers, semiconductors, ceramics, metals, and biomaterials would also be suitable, depending on the final material desired.

As shown in FIG. 1, step 2 of the methods of the present invention involves preparing colloidal nanocrystals for incorporation into the template. It should be noted that steps 1 and 2 may be performed simultaneously or in any order. Although, in general, nanometer-scale particles can be prepared by a variety of methods, the present invention preferably makes use of "colloidal nanocrystals." "Colloidal" implies particles which are easily dispersed in a solvent. This solvent may comprise any type of liquid, but must be chemically compatible (i.e. unreactive) with the template and with the nanocrystals. The particles are formed when the constituent atoms join to form small crystalline nuclei in solution. This process can occur when a solution is made which is saturated with these atoms. Once nanometer-scale nuclei are formed, they are stabilized by a chemical agent known as the "surface cap." The surface cap is a molecule which serves two purposes. One end of the molecule electronically passivates the particles by binding to surface atoms and thereby satisfying dangling bonds. The other end provides a steric barrier to agglomeration and gives the particle its solubility properties. In general, surfactants can satisfy this role; in the examples below, the surface caps are trialkyl phosphines and trialkyl phosphine oxides. By preventing the individual particles from agglomerating, the surface cap maintains the discrete nature of each particle, which ensures that the particles (that is, the nanocrystals) flow into the pores of the template. While the term "colloidal nanocrystals" as used herein includes the preferable use of a colloidal nanocrystal solution including a solvent, the term is intended to embrace nanocrystals in any format which can be flowed into the pores in the template so as to fill the pores, whether or not a solvent is used.

"Nanocrystal" implies particles which have dimensions between approximately 1 nm and 50 nm (although the nanocrystals which may be used in the present invention are in no way limited to these dimensions), but still possess structural properties very similar to a macroscopic piece of the same material (referred to herein as "bulk material"), such as lattice structure, bond spacing, etc. Therefore, structurally, nanocrystals are small fragments of the bulk material. Nanocrystals have been investigated over the last two decades to understand and exploit their unique properties. In particular, they exhibit "quantum size effects" which arise when their finite—size is comparable to or smaller than the natural length scale of an elementary particle of interest an electron, a hole, an exciton, a phonon, etc. For example, due to their size, semiconductor nanocrystals exhibit discrete optical transitions due to the confinement of the electron-hole pair. Their optical spectra are strongly dependent on the size of the particle and are dramatically different from that of the bulk material. In certain embodiments (materials A, D, and F indicated in FIG. 1) of the invention, it is desirable to incorporate the unique properties of the nanocrystals into the patterned structure (the overall quantum-dot solid). In other embodiments (materials B, C, and E indicated in FIG. 1), the nanocrystals are simply used as tools to transport small fragments of the bulk material, which are then fused inside the pores of the template.

The nanocrystals used in this invention can be made from a large variety of materials, including, but not limited to: group I-VII materials such as CuCl, AgBr, or NaCl; group II–VI materials such as ZnO, ZnS, ZnSe, ZnTe, CdS, CdSe, CdTe, HgS, HgSe, HgTe, or alloys of these materials; group III–V materials such as GaP, GaAs, InP, InAs, InSb, or alloys of these materials; group IV materials such as C, Si, Ge, or alloys of these materials; metals such as Ni, Cu, Ag, Pt, or Au; or metal oxides such as silica, titania, alumina, or zirconia. The choice of material used for the nanocrystals will depend on the particular application for the three-dimensionally patterned material, as will be understood by one of ordinary skill in the art.

Figure 3A:
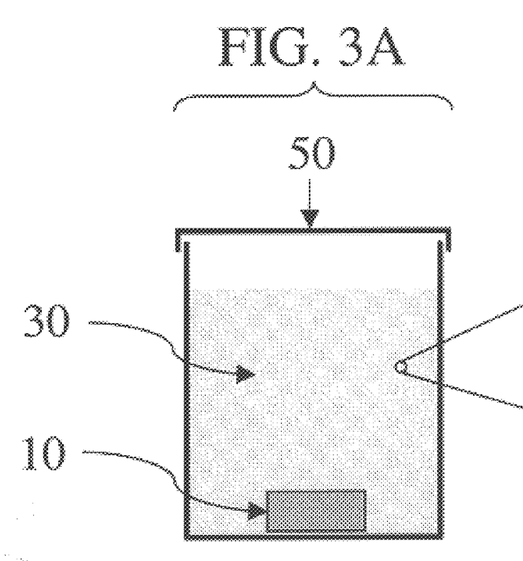
FIG. 3A is a schematic, cross-sectional view illustrating the filling of pores in a template with colloidal nanocrystals in the form of a colloidal nanocrystal solution in accordance with the present invention.
Figure 3B:
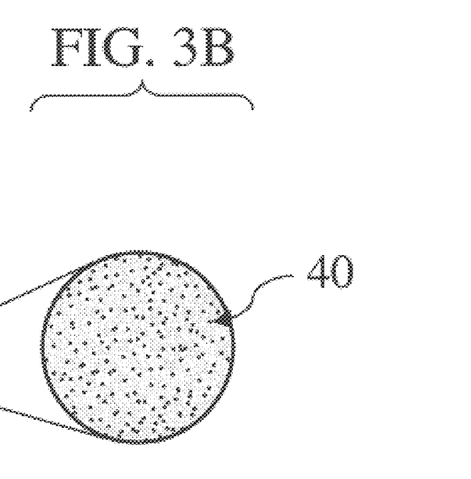
FIG. 3B is a magnified cross-sectional view of a portion of the colloidal nanocrystal solution shown in FIG. 3A.

Once the template and colloidal nanocrystals are obtained, the pores of the template are filled with the colloidal nanocrystals in step 3 as shown in FIG. 1. As discussed above, the pores in the template are the spaces within the template which are not occupied by template material and which will be occupied by the patterned material in the predetermined pattern. Before filling the pores with the colloidal nanocrystals, the pores are preferably occupied by air or other gases, but the pores can also be occupied by a liquid. Accordingly, step 3 is preferably initiated as shown in FIGS. 3A and 3B. The template 10 is immersed in a concentrated colloidal solution 30 of the nanocrystals 40 and at least one solvent as described above. A single solvent or a plurality of solvents may be used. The concentration of the nanocrystals in the solution is chosen so that after evaporation of the solvent or solvents, enough colloidal nanocrystals remain to completely fill the pores in the template. The solvent or solvents for this procedure are preferably chosen such that the colloid slowly destabilizes over time. For example, the method of two solvent recrystallization can be used. See C. Murray et al., supra. The specific solvent or solvents chosen depends on the solubility properties of the nanocrystals, which are determined by the surface cap.

Figure 4A:
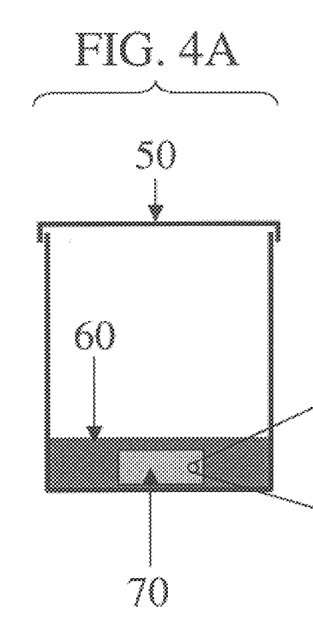
FIG. 4A is a schematic, cross-sectional view illustrating the effect of evaporating a solvent in a colloidal nanocrystal solution within the pores in the template so as to form a quantum-dot solid of close-packed nanocrystals in accordance with the present invention.
Figure 4B:
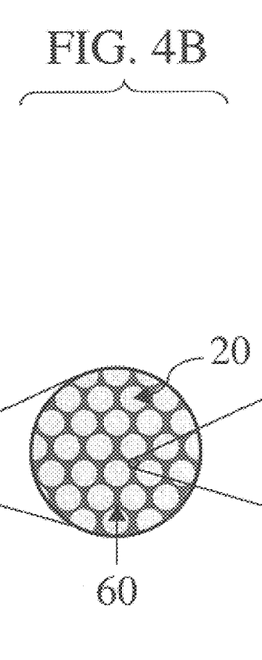
FIG. 4B is a magnified cross-sectional view of a portion of the quantum-dot solid shown in FIG. 4A.
Figure 4C:
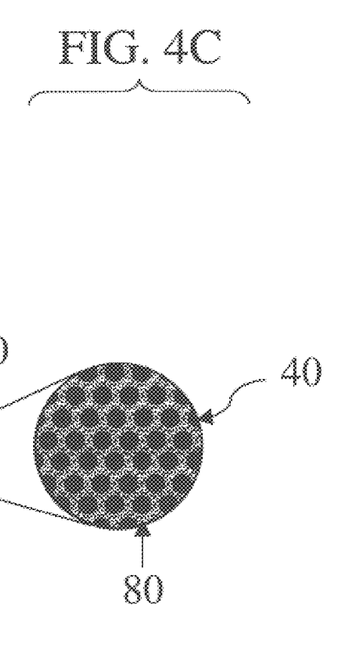
FIG. 4C is a magnified cross-sectional view of a portion of the quantum-dot solid shown in FIG. 4B.

The next step, step 4 shown in FIG. 1, is to form a quantum-dot solid from the colloidal nanocrystals within the pores in the template. In particular, the colloidal nanocrystals are concentrated as close-packed nanocrystals within the pores in the template in the predetermined, three-dimensional pattern. Any method of forming the quantum-dot solid from the colloidal nanocrystals is within the scope of this invention. However, the preferable method for forming the quantum-dot solid from the colloidal nanocrystals is to utilize a colloidal nanocrystal solution including at least one solvent in steps 2 and 3 of FIG. 1, and to evaporate the at least one solvent in the colloidal nanocrystal solution to form the quantum-dot solid within the pores in the template. Preferably, the solvent or solvents are slowly evaporated so that the colloid slowly destabilizes and the nanocrystals stick together and agglomerate in a controlled manner. As shown in FIG. 4A–4C, at the end of this preferable evaporation process, the pores of the template 70 are filled with a quantum-dot solid 60 which is comprised of close-packed nanocrystals 40. Unlike a conventional solid in which atoms or molecules are the fundamental building blocks, referred to herein as "conventional solids," a quantum-dot solid is a material in which the fundamental building block is the nanocrystal. The quantum-dot solid can be either a "crystalline" or "glassy" material. In a crystalline quantum-dot solid, the nanocrystals are arranged on a lattice which possesses long-range order. In a glassy quantum-dot solid, the nanocrystals are still close-packed but have only short-range order. Whether the quantum-dot solid is either crystalline or glassy depends on the rate of formation of the quantum-dot solid. If new nanocrystals attach to the growing solid slowly, each nanocrystal has sufficient time to find its equilibrium position in the crystalline lattice. If new nanocrystals do not have enough time to find their lattice positions, they arbitrarily stick to the solid and form a glassy material with no long-range order. While general methods for preparing both types of quantum-dot solids from colloidal nanocrystals are known (see C. Murray et al., supra), and both semiconductor and metallic nanocrystals have been used to demonstrate these techniques (see S. Harfenist et al., "Three-Dimensional Hexagonal Close-Packed Superlattice of Passivated Ag Nanocrystals," *Advanced Materials,* Vol. 9, No. 10, pp. 817–822 (1997)), the nanometer-length scale patterning provided by the present invention is a novel advance over the prior art.

Quantum-dot solids allow material properties to be specifically tailored by first choosing the nanocrystal building blocks and then controlling the interaction or coupling between the nanocrystals. In particular, this coupling, which is changed by modifying the spacing between the nanocrystals either chemically (with different surface caps) or externally (e.g. with pressure, see G. Markovich et al., "Reversible Metal-Insulator Transition in Ordered Metal Nanocrystal Monolayers Observed by Impedance Spectroscopy," *Physical Review Letters,* Vol. 80, No. 17, pp. 3807–3810 (Apr. 27, 1998)), strongly influences the electronic structure of the solid and therefore affects its optical and conductive properties. In certain embodiments (resulting in materials A, D, and F indicated in FIG. 1), this invention provides the ability to pattern such quantum-dot solids in three dimensions for device or photonic crystal applications.

The simplest material produced by the present invention is material A indicated in FIG. 1, a quantum-dot solid which is both patterned in three dimensions and supported by the template. The word "supported" does not necessarily mean that the quantum dot solid would fall apart if the template were removed (see below). While the template may provide additional mechanical strength to the quantum dot solid or conventional solid (thereby providing, for example, the ability to cut, polish, or otherwise manipulate the material), the template may also provide other properties, such as electrical connection to the quantum-dot solid or optical properties.

If, instead of a patterned quantum-dot solid, a conventional solid is required, the nanocrystals can be sintered inside the template as indicated by step 5 shown in FIG. 1. In general, sintering implies the formation of a solid by fusing together small particles by heat. The individual nanocrystals in a quantum-dot solid fuse when they are heated above their melting point. Due to their finite size, the melting point of a nanocrystal can be dramatically reduced from the melting point of the bulk material. See A. Goldstein et al., "Melting in Semiconductor Nanocrystals," *Science,* Vol. 256, pp. 1425–1427 (Jun. 5, 1992); and U.S. Pat. No. 5,262,357 to Alivisatos et al., U.S. Pat. No. 5,491,114 to Goldstein, U.S. Pat. No. 5,559,057 to Goldstein, U.S. Pat. No. 5,576,248 to Goldstein, and U.S. Pat. No. 5,711,803 to Pehnt et al. Therefore, the nanocrystals may be fused under moderate temperatures (typically much less than 1000° C.), and the template is not required to have extremely high thermal stability. Since the surface caps are loosely bound to the nanocrystal surface, they are removed at even lower temperatures (typically less than 500° C.). After sintering, a conventional solid is obtained which is both three-dimensionally patterned and supported by the template (material B indicated in FIG. 1).

Figure 5A:
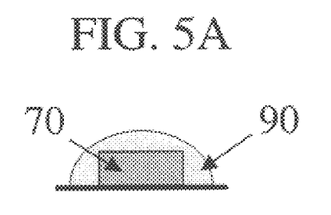
Figure 5B:
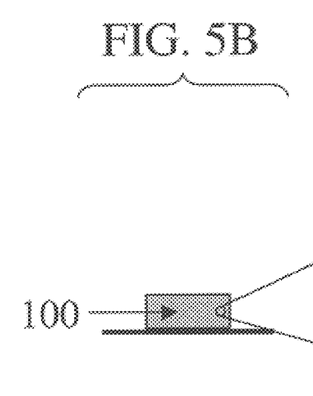
Figure 5C:
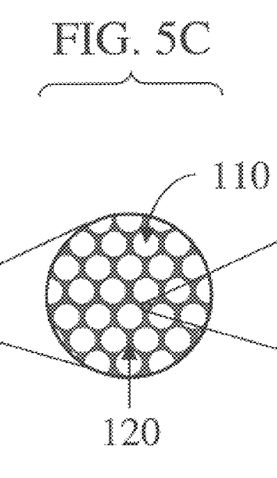
Figure 5D:
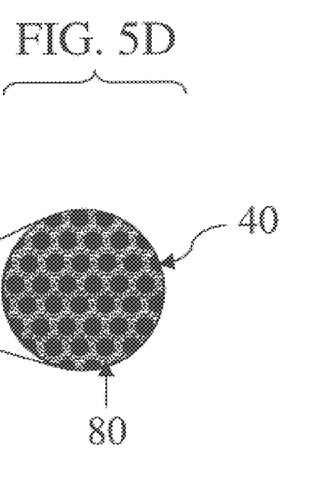
Figure 6A:
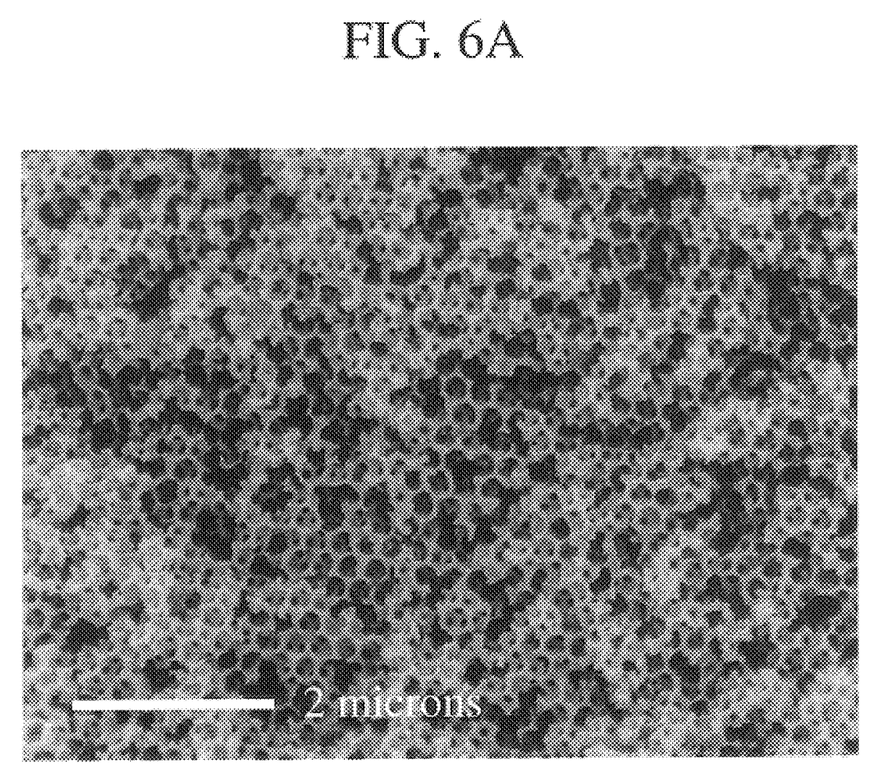
FIGS. 6A and 6B are high-resolution scanning electron micrographs (at different magnifications as indicated by the scale bars) of the same surface of a three-dimensionally patterned CdSe quantum-dot solid according to the present invention, showing a fracture surface that was originally deep inside the structure to demonstrate that the nanocrystals fill the pores in the template.
Figure 6B:
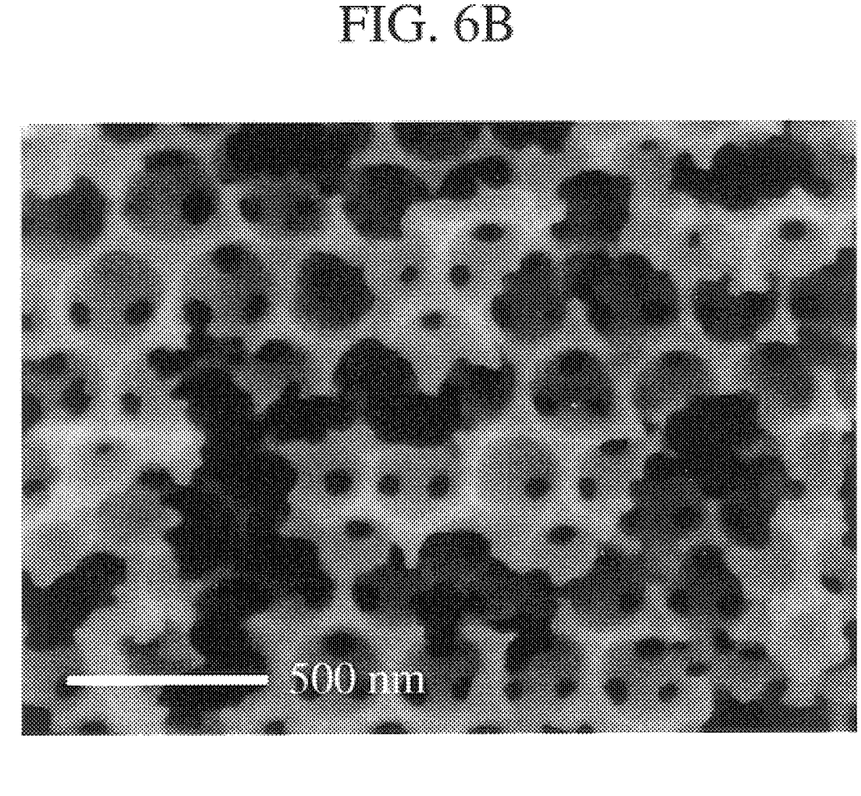

If desired, the template may be removed in a template removal step 6 after the quantum-dot solid formation step 4 shown in FIG. 1 or, if the sintering step 5 is performed, the template may be removed by a template removal step 7. Although any method of removing the template is encompassed by the invention, template removal is preferably accomplished by chemical means, such as a template-selective etching process as shown in FIGS. 5A–5D. The filled template 70 is immersed in a template-selective etchant 90. After the etching process, the template has been removed from the material 100, leaving in its place voids 110. Voids 110 may be unoccupied (e.g. subject to a vacuum), or occupied by a liquid, a gas (such as air), or filled with a supporting material as described below. The removal of the template is particularly important for photonic crystal applications, in which the highest contrast in the index of refraction is achieved when the template is replaced by air or vacuum. If the nanocrystals are sintered, a self-supporting, three-dimensionally patterned conventional solid is obtained (material C indicated in FIG. 1). If the nanocrystals are not sintered before this removal, a self-supporting, three-dimensionally patterned quantum-dot solid 120 is obtained (material D indicated in FIG. 1). In both cases, the solid is configured according to the predetermined, three-dimensional pattern (that is, the "negative" of the negative pattern of the original template). An example of material D is shown in FIGS. 6A and 6B. Two electron micrographs, at medium magnification (FIG. 6A) and high magnification (FIG. 6B), show a CdSe quantum-dot solid which is formed by filling the pores of a synthetic opal and then etching away the silica spheres (see Example 2 below).

Finally, if the template has been removed, the space once occupied by the template can be refilled with a "supporting material" as shown by steps 8 and 9 in FIG. 1. For example, a supporting material may be used to infiltrate the structure as a liquid and then solidified. A particular example is a supporting material having a melting point lower than that of the patterned material after evaporation or sintering, which supporting material could be melted, introduced in the voids in the patterned material, and then allowed to cool so as to resolidify. In much the same way as the template as described above, in either the patterned quantum-dot solid (material F indicated in FIG. 1) or the patterned conventional solid (material E indicated in FIG. 1), such a supporting material can provide additional mechanical, electrical, or optical properties which provide "support" by enhancing the behavior of the overall structure according to its intended use. In terms of photonic crystals, the supporting material may, for example, comprise a polymer with low index of refraction (e.g. an index of refraction less than about 1.4) to provide mechanical strength or packaging capabilities.

To further illustrate the invention, several examples of performing the methods of the invention and producing the materials of the invention will now be described. These examples are merely illustrative and are not to be construed as limiting the invention in any way.

EXAMPLE 1

A synthetic opal is utilized as the template and CdSe semiconductor nanocrystals are used to fill the pores of the template.

Preparing The Template: Synthetic opals are fabricated in a multi-step process. First, monodisperse silica colloids are synthesized by standard methods. See, e.g., W. Stöber et al., "Controlled Growth of Monodisperse Silica Spheres in the Micron Size Range," *Journal of Colloid and Interface Science,* Vol. 26, pp. 62–69 (1968). Using these procedures, which utilize the hydrolysis and condensation of tetraethoxysilane (TEOS), monodisperse silica particles with mean diameters ranging from 50 to 2000 nm can be produced. For example, silica particles with mean diameters of ~250 nm are prepared by injecting 4.8 ml of freshly distilled TEOS to a mixture of 69.4 ml anhydrous ethanol, 2.5 ml of an aqueous ammonium hydroxide solution (28% by weight), and 23.4 ml of deionized water. The mixture turns turbid in less than 10 minutes indicating the formation of sub-micron silica particles. The mixture is stirred at room temperature for 24 hours. With careful removal of nucleation centers such as dust or contaminants in the reaction vessel prior to the above reaction, the particle size distribution can be made less than 5% (rms deviation). The particles are removed from the reaction solution by subsequent centrifugation and diluted in deionized water. Careful centrifugation may also be used to further improve the particle size distribution.

Second, the silica spheres are self-assembled into an ordered array. If the silica colloid obtained above is sufficiently dilute (less than about 5% by weight) the individual spheres interact as hard spheres. Such a dilute silica colloid is allowed to sediment over prolonged periods (weeks to months, depending on the desired thickness) unto a flat substrate. During sedimentation, the silica spheres naturally form an ordered array which is mostly face-centered cubic (fcc). After sedimentation, individual silica spheres are in contact, but not fused.

Finally, to obtain a synthetic opal, the sediment is annealed under hydrothermal conditions (e.g. 250° C. at 220 MPa for 20 minutes; see Yanagisawa et al., "Neck Formation of Spherical Silica Particles by Hydrothermal Hot Pressing," *Journal of Materials Science Letters,* Vol. 10, pp. 7–8 (1991)). This treatment causes each individual silica sphere to soften and fuse slightly with its neighbors. Therefore, the result is an interconnected network of spheres ordered on a fcc lattice, thereby leaving pores between the spheres. By varying the hydrothermal conditions, one can control the final porosity and hardness of the opal.

Preparing The Colloidal Nanocrystals: Monodisperse CdSe nanocrystals are synthesized according to the method of C. Murray et al., "Synthesis and Characterization of Nearly Monodisperse CdE (E=S, Se, Te) Semiconductor Nanocrystallites," *Journal of the American Chemical Society,* Vol. 115, No. 19, pp. 8706–8715 (1993). This method produces nanocrystals with a mean diameter ranging from 12 Å to 115 Å and a size distribution less than 5% (rms deviation). In a typical preparation, 10 g of dried and degassed tri-n-octylphosphine oxide (TOPO) is stirred and heated under (that is, in the presence of) nitrogen to 320° C. A syringe filled with 10 ml tri-n-octylphosphine, 1.2 ml of 1 M trioctylphosphine selenide, and 100 $\mu$l dimethylcadmium is then added to the stirring pot of TOPO in a single, rapid injection. While this reaction directly yields nanocrystals with a mean diameter of ~19 Å, additional growth occurs when the reaction solution is stirred at ~250° C. for several hours. The size of the nanocrystals can be determined during growth by periodically monitoring the optical absorption spectrum of a small portion of the reaction solution. When the desired size is obtained, the heat is removed and the solution is cooled. The nanocrystals are then isolated from the reaction solution by addition of an equal volume of anhydrous methanol. The resulting powder can be dispersed in a variety of organic solvents. Repeated isolation of the nanocrystals with alcohols can further improve the purity of the particles as well as their size distribution.

Filling the Pores in the Template with the Colloidal Nanocrystals, and Forming the Quantum-Dot Solid: FIGS. 2–4 demonstrate the process of filling the template with nanocrystals. The template, a millimeter-scale opal chip 10, is shown in FIGS. 2A and 2B. As described above, it is composed of individual sub-micron silica spheres 20 which are arranged on a fcc lattice and fused due to hydrothermal annealing. (For simplicity, the drawings do not show the "necks" which connect the individual silica spheres.) In FIGS. 3A and 3B, the opal chip 10 is immersed in a concentrated solution 30 of nanocrystals 40. The solution 30 is prepared by dispersing ~100 mg of powdered CdSe nanocrystals in 0.5 ml decane. A barrier 50 is then placed on the container such that the solvent (decane) evaporates extremely slowly, over several weeks to months. For example, a glass vial may be used with a plastic screw cap. Even with the cap tightly sealed, the decane slowly leaks from the vial. As shown in FIGS. 4A–4C, the nanocrystals 40 then form a quantum-dot solid 60. This solid is optically clear but colored due to the absorption of the nanocrystals. The opal chip 70 is now impregnated with nanocrystals 40 which fill the pores between the individual silica spheres 20. The nanocrystals are close-packed and are separated by their surface cap 80. The quantum-dot solid may possess glassy or crystalline order. Once the quantum-dot solid has formed, the barrier 50 is removed and the opal chip 70 is extracted from the surrounding solid by mechanical cutting, grinding, or polishing. A CdSe quantum-dot solid, which is three-dimensionally patterned according to the synthetic opal (specifically, the CdSe quantum-dot solid is ordered on an inverse fcc lattice) and is supported by the synthetic opal, is obtained. This material corresponds to material A indicated in FIG. 1.

EXAMPLE 2

Beginning with the material obtained in Example 1, the template may then be removed.

Removing the Template After Formation of the Quantum-Dot Solid: FIGS. 5A–5B demonstrates this process for a silica template, such as a synthetic opal. While silica is easily etched by hydrofluoric acid (HF), quantum-dot solids made from semiconductor nanocrystals are resistant to this treatment. A drop of 5% by weight HF solution 90 is placed on the filled opal chip 70 and allowed to stand. The dilute HF quickly etches away the silica spheres while not affecting the quantum-dot solid. After 5 minutes the HF solution 90 is wicked away and the sample 100 is dried under vacuum. A self-supporting quantum-dot solid is obtained in which the original close-packed network of silica spheres are replaced by "air" spheres 110. The close-packed nanocrystals 40 remain separated by their surface cap 80. The CdSe quantum-dot solid is three-dimensionally patterned according to the synthetic opal. This material corresponds to material D indicated in FIG. 1.

FIGS. 6A and 6B show two high resolution scanning electron micrographs at different magnifications of such a material. The synthetic opal was composed of silica spheres with mean diameters of ~150 nm. This template was then filled with ~35 Å diameter CdSe nanocrystals and removed with HF. This unsupported quantum-dot solid was then fractured. The images in FIGS. 6A and 6B, which show this fracture surface, demonstrate that the quantum-dot solid filled the entire template.

EXAMPLE 3

Beginning with the material obtained in Example 1, the CdSe quantum-dot solid may then be sintered to form a conventional solid according to the method of A. Goldstein et al., "Melting in Semiconductor Nanocrystals," *Science*, Vol. 256, pp. 1425–1427 (Jun. 5, 1992); and U.S. Pat. No. 5,262,357 to Alivisatos et al.

Sintering the Nanocrystals Within the Pores of the Template: Once filled with CdSe nanocrystals, the opal chip is sealed under vacuum or inert gas inside a quartz tube. The tube is heated to 600–800° C., depending on the size of the nanocrystals, for 5–15 minutes. The tube is cooled and the chip is removed. A conventional CdSe solid, which is three-dimensionally patterned according to, and supported by, the opal template, is obtained. This material corresponds to material B indicated in FIG. 1.

EXAMPLE 4

Removing the Template After Sintering: Beginning with the material obtained in Example 3, the template may then be removed as in Example 2. A self-supporting CdSe conventional solid, which is three-dimensionally patterned according to the synthetic opal, is obtained. This material corresponds to material C indicated in FIG. 1.

EXAMPLE 5

Beginning with the material obtained in Example 4, the space previously occupied by the template may be refilled.

Refilling the Voids in the Template: To refill with a polymer or gel, monomers are used to re-enter the structure as a liquid under ambient conditions and then polymerized. A self-supporting CdSe conventional solid, which is three-dimensionally patterned according to the synthetic opal and is supported by the new polymer or gel material, is obtained. This material corresponds to material E indicated in FIG. 1.

EXAMPLE 6

Refilling the Voids in the Template: Beginning with the material obtained in Example 2, the space previously occupied by the template may be refilled as in Example 5. A self-supporting CdSe quantum-dot solid, which is three-dimensionally patterned according to the synthetic opal and is supported by the new polymer or gel material, is obtained. This material corresponds to material F indicated in FIG. 1.

While there has been described and illustrated herein methods for creating three-dimensional patterned materials using nanocrystals, it will be apparent to those skilled in the art that further variations and modifications are possible without deviating from the broad teachings and spirit of the invention which shall be limited solely by the scope of the claims appended hereto.

What is claimed is:

1. A method for patterning a quantum-dot solid according to a predetermined, three-dimensional pattern, the method comprising the steps of:

(a) preparing a template comprising a template material, the template having a plurality of pores therein, the plurality of pores comprising a negative of the predetermined, three-dimensional pattern;

(b) preparing nanocrystals sufficient to fill the pores in the template, wherein the pores in the template are larger than the nanocrystals;

(c) filling the pores in the template with the nanocrystals; and (d) forming a quantum-dot solid from the nanocrystals within the pores in the template, such that the nanocrystals are concentrated as close-packed nanocrystals within the pores in the template in the predetermined, three-dimensional pattern.

2. The method of claim 1, wherein the nanocrystals are colloidal nanocrystals.

3. The method of claim 1, wherein the pores in the template are contiguous.

4. The method of claim 1, wherein step (a) is a self-assembly process that automatically establishes the negative of the predetermined three-dimensional pattern in the template.

5. The method of claim 1, wherein the template material is comprised of silica.

6. The method of claim 1, wherein the template material is comprised of synthetic opal.

7. The method of claim 1, wherein the nanocrystals are colloidal nanocrystals, and wherein step (b) includes the sub-step of:

(b-1) dispersing the colloidal nanocrystals in at least one solvent which is unreactive with respect to the template to provide a colloidal nanocrystal solution for filling the pores in the template in step (c).

8. The method of claim 7, wherein the proportions of the colloidal nanocrystals and the at least one solvent are selected so that there is a sufficient quantity of nanocrystals to completely fill the pores in the template after step (d) is performed.

9. The method of claim 7, wherein the at least one solvent permits the colloidal nanocrystal solution to destabilize slowly over time.

10. The method of claim 7, wherein step (b) further includes the sub-step of:

(b-2) adding a surface cap to the at least one solvent in which the colloidal nanocrystals are dispersed, whereby the colloidal nanocrystals are stabilized by the surface cap in the at least one solvent, and the colloidal nanocrystals are prevented from agglomerating prior to step (c).

11. The method of claim 10, wherein the surface cap is a surfactant.

12. The method of claim 10, wherein the surface cap is selected from the group consisting of trialkyl phosphines and trialkyl phosphine oxides.

13. The method of claim 10, further comprising the step of removing the surface cap from the close-packed nanocrystals after step (d), whereby the close-packed nanocrystals are in direct contact with one another but are not fused to one another.

14. The method of claim 7, wherein step (c) includes the sub-step of:

(c-1) immersing the template in the colloidal nanocrystal solution so that the colloidal nanocrystal solution infiltrates the pores in the template so as to fill the pores in the template with the colloidal nanocrystals.

15. The method of claim 14, wherein step (d) includes the sub-step of:

(d-1) evaporating the at least one solvent in the colloidal nanocrystal solution to form the quantum-dot solid.

16. The method of claim 15, wherein the at least one solvent is evaporated at a rate which yields a glassy quantum-dot solid.

17. The method of claim 15, wherein the at least one solvent is evaporated at a rate which yields a crystalline quantum-dot solid.

18. The method of claim 1, wherein the nanocrystals have diameters between about 1 nm and about 50 nm.

19. The method of claim 1, wherein the nanocrystals are selected from the group consisting of: (i) group I–VII materials; (ii) group II–VI materials; (iii) group III–V materials; (iv) group IV materials; (v) metals; and (vi) metal oxides.

20. The method of claim 19, wherein the group I–VII materials are selected from the group consisting of CuCl, AgBr, and NaCl.

21. The method of claim 19, wherein the group II–VI materials are selected from the group consisting of ZnO, ZnS, ZnSe, ZnTe, CdS, CdSe, CdTe, HgS, HgSe, HgTe, and alloys of these materials.

22. The method of claim 19, wherein the group III–V materials are selected from the group consisting of GaP, GaAs, InP, InAs, InSb, and alloys of these materials.

23. The method of claim 19, wherein the group IV materials are selected from the group consisting of C, Si, Ge, and alloys of these materials.

24. The method of claim 19, wherein the metals are selected from the group consisting of Ni, Cu, Ag, Pt, and Au.

25. The method of claim 19, wherein the metal oxides are selected from the group consisting of silica, titania, alumina, and zirconia.

26. The method of claim 1, wherein the quantum-dot solid is supported by the template.

27. A quantum-dot solid patterned according to a predetermined, three-dimensional pattern, manufactured according to the method of claim 1.

28. The method of claim 1, further comprising the step of:

(e) removing the template, such that a plurality of voids are provided in the quantum-dot solid in positions which were occupied by the template prior to the removal of the template, wherein the quantum-dot solid is self-supporting.

29. A quantum-dot solid patterned according to a predetermined, three-dimensional pattern, manufactured according to the method of claim 28.

30. The method of claim 28 wherein step (e) includes the sub-step of:

(e-1) immersing the template in a template-selective etchant.

31. The method of claim 28, further comprising the step of:

(f) refilling the voids with a supporting material.

32. A quantum-dot solid patterned according to a predetermined, three-dimensional pattern, manufactured according to the method of claim 31.

33. The method of claim 31, wherein the supporting material has a melting point which is lower than that of the close-packed nanocrystals, and wherein the refilling step (f) further comprises the sub-steps of:

(f-1) melting the supporting material so that the supporting material is liquefied;

(f-2) infiltrating the voids in the quantum-dot solid with the liquefied supporting material; and (f-3) solidifying the liquefied supporting material within the voids in the quantum-dot solid.

34. The method of claim 31, wherein the supporting material is a polymer having an index of refraction that is lower than that of the close-packed nanocrystals.

35. A method for patterning a conventional solid according to a predetermined, three-dimensional pattern, the method comprising the steps of:

(a) preparing a template comprising a template material, the template having a plurality of pores therein, the plurality of pores comprising a negative of the predetermined three-dimensional pattern;

(b) preparing nanocrystals sufficient to fill the pores in the template, wherein the pores in the template are larger than the nanocrystals;

(c) filling the pores in the template with the nanocrystals;

(d) forming a quantum-dot solid from the nanocrystals within the pores in the template, such that the nanocrystals are concentrated as close-packed nanocrystals within the pores in the template in the predetermined, three-dimensional pattern; and (e) sintering the close-packed nanocrystals within the pores in the template.

36. The method of claim 35, wherein the nanocrystals are colloidal nanocrystals.

37. The method of claim 35, wherein the pores in the template are contiguous.

38. The method of claim 35, wherein step (a) is a self-assembly process that automatically establishes the negative of the predetermined three-dimensional pattern in the template.

39. The method of claim 35, wherein the template material is comprised of silica.

40. The method of claim 35, wherein the template material is comprised of synthetic opal.

41. The method of claim 35, wherein the close-packed nanocrystals have a melting point that is lower than a melting point of the template material.

42. The method of claim 35, wherein the nanocrystals are colloidal nanocrystals, and wherein step (b) includes the sub-step of:

(b-1) dispersing the colloidal nanocrystals in at least one solvent which is unreactive with respect to the template to provide a colloidal nanocrystal solution for filling the pores in the template in step (c).

43. The method of claim 42, wherein the proportions of the colloidal nanocrystals and the at least one solvent are selected so that there is a sufficient quantity of nanocrystals to completely fill the pores in the template after step (d) is performed.

44. The method of claim 42, wherein the at least one solvent permits the colloidal nanocrystal solution to destabilize slowly over time.

45. The method of claim 42, wherein step (b) further includes the sub-step of:

(b-2) adding a surface cap to the at least one solvent in which the colloidal nanocrystals are dispersed, whereby the colloidal nanocrystals are stabilized by the surface cap in the at least one solvent, and the colloidal nanocrystals are prevented from agglomerating prior to step (c).

46. The method of claim 45, wherein the surface cap is a surfactant.

47. The method of claim 45, wherein the surface cap is selected from the group consisting of trialkyl phosphines and trialkyl phosphine oxides.

48. The method of claim 45, further comprising the step of removing the surface cap from the close-packed nanocrystals after step (d) and before step (e), whereby the surface cap is removed prior to sintering the quantum-dot solid.

49. The method of claim 42, wherein step (c) includes the sub-step of:

(c-1) immersing the template in the colloidal nanocrystal solution so that the colloidal nanocrystal solution infiltrates the pores in the template so as to fill the pores in the template with the colloidal nanocrystals.

50. The method of claim 49, wherein step (d) includes the sub-step of:

(d-1) evaporating the at least one solvent in the colloidal nanocrystal solution to form the quantum-dot solid.

51. The method of claim 35, wherein the nanocrystals have diameters between about 1 nm and about 50 nm.

52. The method of claim 35, wherein the nanocrystals are selected from the group consisting of: (i) group I–VII materials; (ii) group II–VI materials; (iii) group III–V materials; (iv) group IV materials; (v) metals; and (vi) metal oxides.

53. The method of claim 52, wherein the group I–VII materials are selected from the group consisting of CuCl, AgBr, and NaCl.

54. The method of claim 52, wherein the group II–VI materials are selected from the group consisting of ZnO, ZnS, ZnSe, ZnTe, CdS, CdSe, CdTe, HgS, HgSe, HgTe, and alloys of these materials.

55. The method of claim 52, wherein the group III–V materials are selected from the group consisting of GaP, GaAs, InP, InAs, InSb, and alloys of these materials.

56. The method of claim 52, wherein the group IV materials are selected from the group consisting of C, Si, Ge, and alloys of these materials.

57. The method of claim 52, wherein the metals are selected from the group consisting of Ni, Cu, Ag, Pt, and Au.

58. The method of claim 52, wherein the met al oxide s are selected from the group consisting of silica, titania, alumina, and zirconia.

59. The method of claim 35, wherein the conventional solid is supported by the template.

60. The method of claim 35, further comprising the step of:

(f) removing the template, such that a plurality of voids are provided in the conventional solid in positions which were occupied by the template prior to the removal of the template, wherein the conventional solid is self-supporting.

61. The method of claim 60, wherein step (f) includes the sub-step of:

(f-1) immersing the template in a template-selective etchant.

62. The method of claim 60, further comprising the step of:

(g) refilling the voids with a supporting material.

63. The method of claim 62, wherein the supporting material has a melting point which is lower than that of the conventional solid, and wherein the refilling step (g) further comprises the sub-steps of:

(g-1) melting the supporting material so that the supporting material is liquefied;

(g-2) infiltrating the voids in the conventional solid with the liquefied supporting material; and (g-3) solidifying the liquefied supporting material within the voids in the conventional solid.

64. The method of claim 62, wherein the supporting material is a polymer having an index of refraction that is lower than that of the conventional solid.

65. A three-dimensionally patterned quantum-dot solid, comprising close-packed nanocrystals configured according to a predetermined, three-dimensional pattern, wherein the predetermined, three-dimensional pattern includes regions which are occupied by the close-packed nanocrystals and regions which are not occupied by the close-packed nanocrystals.

66. The three-dimensionally patterned quantum-dot solid of claim 65, wherein the regions which are occupied by the close-packed nanocrystals are contiguous.

67. The three-dimensionally patterned quantum-dot solid of claim 65, wherein the close-packed nanocrystals are arranged with long-range order so as to form a crystalline quantum-dot solid.

68. The three-dimensionally patterned quantum-dot solid of claim 65, wherein the close-packed nanocrystals are arranged with short-range order so as to form a glassy quantum-dot solid.

69. The three-dimensionally patterned quantum-dot solid of claim 65, wherein the nanocrystals have diameters between about 1 nm and about 50 nm.

70. The three-dimensionally patterned quantum-dot solid of claim 65, wherein the nanocrystals are selected from the group consisting of: (i) group I–VII materials; (ii) group II–VI materials; (iii) group III–V materials; (iv) group IV materials; (v) metals; and (vi) metal oxides.

71. The three-dimensionally patterned quantum-dot solid of claim 70, wherein the group I–VII materials are selected from the group consisting of CuCl, AgBr, and NaCl.

72. The three-dimensionally patterned quantum-dot solid of claim 70, wherein the group II–VI materials are selected from the group consisting of ZnO, ZnS, ZnSe, ZnTe, CdS, CdSe, CdTe, HgS, HgSe, HgTe, and alloys of these materials.

73. The three-dimensionally patterned quantum-dot solid of claim 70, wherein the group III–V materials are selected from the group consisting of GaP, GaAs, InP, InAs, InSb, and alloys of these materials.

74. The three-dimensionally patterned quantum-dot solid of claim 70, wherein the group IV materials are selected from the group consisting of C, Si, Ge, and alloys of these materials.

75. The three-dimensionally patterned quantum-dot solid of claim 70, wherein the metals are selected from the group consisting of Ni, Cu, Ag, Pt, and Au.

76. The three-dimensionally patterned quantum-dot solid of claim 70, wherein the metal oxides are selected from the group consisting of silica, titania, alumina, and zirconia.

77. The three-dimensionally patterned quantum-dot solid of claim 65, further comprising a plurality of surface cap molecules, each of the close-packed nanocrystals being bound to at least one surface cap molecule.

78. The three-dimensionally patterned quantum-dot solid of claim 77, wherein the surface cap molecules are surfactant.

79. The three-dimensionally patterned quantum-dot solid of claim 77, wherein the surface cap molecules are selected from the group consisting of trialkyl phosphines and trialkyl phosphine oxides.

80. The three-dimensionally patterned quantum-dot solid of claim 65, in which the surface cap molecules are removed and the close-packed nanocrystals are in direct contact with on another, but are not fused to one another.

81. The three-dimensionally patterned quantum-dot solid of claim 65, further comprising a template comprising template material supporting the quantum-dot solid, wherein the template material occupies the regions of the predetermined, three-dimensional pattern which are not occupied by the quantum-dot solid.

82. The three-dimensionally patterned quantum-dot solid of claim 81, wherein the template material is comprised of silica.

83. The three-dimensionally patterned quantum-dot solid of claim 81, wherein the template material is comprised of synthetic opal.

84. The three-dimensionally patterned quantum-dot solid of claim 65, wherein the regions of the predetermined, three-dimensional pattern which are not occupied by the quantum-dot solid are occupied by one of a gas and a vacuum, whereby that the quantum-dot solid is self-supporting, and whereby a high contrast between the indices of refraction of the regions occupied by the close-packed nanocrystals and the regions not occupied by the close-packed nanocrystals is provided.

85. The three-dimensionally patterned quantum-dot solid of claim 84, therein the gas is air.

86. The three-dimensionally patterned quantum-dot solid of claim 65, wherein regions of the predetermined, three-dimensional pattern which are not occupied by the quantum-dot solid are occupied by a supporting material.

87. The three-dimensionally patterned quantum-dot solid of claim 86, wherein the supporting material is a polymer having an index of refraction that is lower than that of the close-packed nanocrystals.

* * * * *